(12) United States Patent
Otsuji et al.

(10) Patent No.: US 8,227,794 B2
(45) Date of Patent: Jul. 24, 2012

(54) COMPLEMENTARY LOGIC GATE DEVICE

(76) Inventors: Taiichi Otsuji, Sendai (JP); Eiichi Sano, Sapporo (JP)

( * ) Notice: Subject to any disclaimer, the term of this patent is extended or adjusted under 35 U.S.C. 154(b) by 0 days.

(21) Appl. No.: 13/054,706

(22) PCT Filed: Jul. 24, 2009

(86) PCT No.: PCT/JP2009/063264

§ 371 (c)(1),
(2), (4) Date: Feb. 15, 2011

(87) PCT Pub. No.: WO2010/010944

PCT Pub. Date: Jan. 28, 2010

(65) Prior Publication Data

US 2011/0156007 A1      Jun. 30, 2011

(30) Foreign Application Priority Data

Jul. 25, 2008    (JP) ................................. 2008-192162

(51) Int. Cl.
*H01L 29/08*    (2006.01)
(52) U.S. Cl. .......................... 257/29; 977/734
(58) Field of Classification Search ..................... 257/29, 257/E21.061; 977/734
See application file for complete search history.

(56) References Cited

U.S. PATENT DOCUMENTS

| | | | |
|---|---|---|---|
| 5,467,048 A | 11/1995 | Watanabe | |
| 2004/0119114 A1* | 6/2004 | King | 257/327 |
| 2008/0312088 A1* | 12/2008 | Chung et al. | 505/193 |

FOREIGN PATENT DOCUMENTS

| | | |
|---|---|---|
| JP | A-07-142568 | 6/1995 |
| JP | A-2004-179564 | 6/2004 |
| JP | A-2005-322836 | 11/2005 |
| JP | A-2007-335532 | 12/2007 |
| JP | A-2008-135413 | 6/2008 |
| JP | A-2008-135415 | 6/2008 |
| WO | WO 2008/108383 A1 | 9/2008 |

OTHER PUBLICATIONS

Novoselov et al., "Two-dimensional gas of massless Dirac fermions in graphene," *Nature*, 2005, vol. 438, pp. 197-200.
Katsnelson, "Graphene: carbon in two dimensions," *Materials Today*, 2007, vol. 10, Nos. 1-2, pp. 20-27.

(Continued)

*Primary Examiner* — William D Coleman
*Assistant Examiner* — Christine Enad
(74) *Attorney, Agent, or Firm* — Oliff & Berridge, PLC

(57) ABSTRACT

Provided is a complementary logical gate device represented by a silicon CMOS logical circuit among semiconductor integrated logical circuits which can effectively solve the problem of the speed performance limit of an ultra-large scale integration and an ultra-low power consumption type logical circuit. The complementary logical gate includes an electron running layer formed by grapheme without using an n-channel FET or a p-channel FET, has the ambipolar characteristic, and uses only two FET having different threshold values, i.e., a first FET and a second FET. The first FET has a gate electrode short-circuited to a gate electrode of the second FET so as to constitute an input terminal. The first FET has a source electrode set to a low potential. The first FET has a drain electrode connected to a source electrode of the second FET so as to constitute an output terminal. The second FET has a drain electrode set to a high potential.

2 Claims, 4 Drawing Sheets

OTHER PUBLICATIONS

Ando, "Physics of Graphene," *Surface Science*, 2008, vol. 29, No. 5, pp. 296-303.

Katsnelson et al., "Chiral tunnelling and the Klein paradox in graphene," *Nature Physics*, 2006, vol. 2, pp. 620-625.

Lin et al., "Chemical Doping of Graphene Nanoribbon Field-Effect Devices," *IEEE*, 2008, pp. 27-28.

Ozyilmaz et al., "Electronic transport in locally gated grapheme nanoconstrictions," *Physical Review Letters*, 2007, vol. 98.

Lemme et al., "A Graphene Field-Effect Device," *IEEE Electron Device Letters*, 2007, vol. 28, No. 4, pp. 282-284.

De Heer et al., "Pionics: the Emerging Science and Technology of Graphene-based Nanoelectronics," *IEEE*, 2007, pp. 199-202.

Chen et al., "Semiconducting Graphene Ribbon Transistor," *IEEE*, 2007, pp. 265-266.

International Search Report in International Application No. PCT/JP2009/063264; dated Oct. 27, 2009.

* cited by examiner

COMPLEMENTARY LOGIC GATE DEVICE

TECHNICAL FIELD

The present invention relates to a semiconductor integrated logic circuit and particularly to a complementary logic gate device useful in overcoming a speed performance limitation of an ultra large-scale integration and ultra low power consumption integrated logic device composed of a complementary logic gate device represented by a silicon CMOS (complementary metal oxide film Semiconductor) logic circuit.

BACKGROUND ART

Since a silicon CMOS logic gate device has both ultra large-scale integration and ultra low power consumption performances, it forms a core of the current semiconductor integrated circuit technology. As in a configuration example of the logic gate device in the prior-art technology shown in FIG. 6, in the CMOS logic gate, by combining and complementarily operating an n-type channel MOSFET (metal oxide film semiconductor type electric field effect transistor) and a p-type channel MOSFET, such a characteristic is provided that an operating current does not flow when an input/output logic level is a low level or a high level, and the operating current flows only while the logic level is in transition as an operating current/output voltage characteristic shown in FIG. 7. This fact gives the ultra low power consumption performances. Usually, in the MOSFET, an n-type semiconductor and a p-type semiconductor are formed by doping donor and acceptor impurities by a so-called channel doping technology.

Hitherto, by reducing a distance and time in which an electron/hole runs between electrodes by means of miniaturization of an element, speed-up of a transistor FET and hence, a logic gate device has been promoted. However, in recent years when a characteristic dimension of the FET (electric field effect transistor) is approaching 10 nm at which a quantum-mechanical tunnel effect might be incurred, it has already become difficult to achieve speed-up by miniaturization of an element. Therefore, introduction of a material excellent in carrier transport property which can transport an electron/hole at a higher speed than a semiconductor material including silicon currently in use is a method left for speed-up.

With such a background, a single-layer sheet of carbon forming a hexagonal lattice structure: graphene is far more excellent in electron transport property than any existing semiconductor and attracts attention as a new semiconductor material which can drastically improve a speed performance of transistor performances faced with a limitation of miniaturization. As for graphene, the highest point in the valence band is present at the K point, which borders with the lowest point of a conduction band. That is, there is no band gap. At the same time, since both the conduction band and the valence band have symmetric linear dispersion property in the vicinity of the K point, an effective mass does not exist either in electron/hole and thus, electron mobility is higher than the prior-art semiconductor material by one digit or more and hole mobility is also equivalent, which is an excellent carrier transport property that cannot be realized by the prior-art semiconductor material (See Non-Patent Documents 1, 2, and 3, for example).

However, graphene cannot realize a logic operation equivalent to CMOS by substituting MOSFET as it is due to the following two points. The first point is that since doping of impurities is extremely difficult, it is only a so-called intrinsic semiconductor characteristic that can be provided, and realization of an n-type or p-type semiconductor characteristic having sufficient carrier concentration is extremely difficult (See Non-Patent Documents 1, 4, and 5, for example). The second point is that since a band gap is not present and an electron/hole is present equally in graphene, an operation as an FET has a so-called ambipolar characteristic (single pole bilateral characteristic) having both a region operated in an electron mode when a gate bias is higher than a gate threshold potential and a region operated in a hole mode when the gate bias is lower than the gate threshold potential. Therefore, even if the gate bias falls below the threshold value, the FET is not brought into an OFF state (See Non-Patent Documents 6, 7, 8, and 9, for example). Due to the above reasons, in a FET having a graphene material as an electron channel layer (channel), a configuration of a CMOS logic gate composed of a p-type channel FET and an n-type channel FET is impossible, and thus, a configuration of a CMOS-compatible complementary gate which can realize the current ultra low power consumption and super large integration has been impossible.

CITATION LIST

Non-Patent Literature

[Non-Patent Document 1] K. S. Novoselov, et al., "Two-dimensional gas of massless Dirac fermions in graphene", Nature, 10 Nov. 2005, Vol. 438, p. 197-200

[Non-Patent Document 2] Mikhail I. Katsnelson, "Graphene: carbon in two dimensions", Materials today, January 2007, Vol. 10, No. 1-2, p. 20-27

[Non-Patent Document 3] Tsuneya Ando, "Unique Physics of Graphene", Surface Science, 2008, Vol. 29, No. 5, p. 296-303

[Non-Patent Document 4] M. I. Katsnelson, et al., "Chiral tunnelling and the Klein paradox in graphene", Nature Physics, September 2006, Vol. 2, p. 620-625

[Non-Patent Document 5] Yu-Ming Lin, et al., "Chemical Doping of Graphene Nanoribbon Field-Effect Devices", 66th Device Research Conference Digest, Santa Barbara, Calif., June 2008, p. 27-28

[Non-Patent Document 6] Barbaros Ozyilmaz, et al., "Electronic transport in locally gated graphene nanoconstrictions", Physical Review Letters, 2007, Vol. 98, Iss. 206805

[Non-Patent Document 7] Max C. Lemme, et al., "A Graphene Field-Effect Device", IEEE Electron Device Letters, April 2007, Vol. 28, No. 4, p. 282-284

[Non-Patent Document 8] Walt A. de Heer, et al., "Pionics: the Emerging Science and Technology of Graphene-based Nanoelectronics", International Electron Device Meeting (IEDM) Technical Digest, Washington D.C., December 2007, p. 199-202

[Non-Patent Document 9] Zhihong Chen and Phaedon Avouris, "Semiconducting Graphene Ribbon Transistor", 65th Device Research Conference Digest, Notre Dome, June 2007, p. 265-266

SUMMARY OF INVENTION

Technical Problem

The present invention has an object to solve the prior-art problems to provide a semiconductor integrated logic circuit and particularly a complementary logic gate device useful in overcoming a speed performance limitation of an ultra large-scale integration and ultra low power consumption integrated logic circuit composed of a complementary logic gate device represented by a silicon CMOS logic circuit.

Solution to Problem

In order to achieve the above object, a complementary logic gate device according to the present invention is characterized in that the device has a first FET and a second FET with an electron channel layer formed by a graphene material, an ambipolar characteristic, and different threshold values, and that a gate electrode of the first FET and a gate electrode of the second FET are short-circuited to have an input terminal, a source electrode of the first FET is set at a low potential, a drain electrode of the first FET and a source electrode of the second FET are connected to have an output terminal, and a drain electrode of the second FET is set at a high potential.

In the complementary logic gate device according to the present invention, it is preferable that the device is provided without using an n-type channel FET and a p-type channel FET but has only two FETs with an ambipolar characteristic (single pole bilateral characteristic) and different threshold values, and that gate electrodes of the both FETs are short-circuited to have an input terminal, a source electrode of the first FET is set at a low potential, a drain electrode of the first FET and a source electrode of the second FET are connected to each other to have an output terminal, and a drain electrode of the second FET is set at a high potential. Also, in the first FET and the second FET, an electron channel layer is preferably formed only by a semiconductor in an intrinsic state having graphene as a material.

In the complementary logic gate device according to the present invention, it is preferable that a threshold value of the first FET is set as a first level, a threshold value of the second FET is set as a second level higher than the first level, and a logic low level and a logic high level of an input signal is matched with the first level and the second level, respectively.

In the complementary logic gate device according to the present invention, each of the first FET and the second FET may be so configured that the electron channel layer is sandwiched by a pair of insulating layers, a first gate electrode is formed on the surface of one of the insulating layers, a second gate electrode is formed on the surface of the other insulating layer, a voltage of the threshold value can be controlled by a voltage applied to the first gate electrode, and a current in the electron channel layer can be controlled by a voltage applied to the second gate electrode, respectively.

In the complementary logic gate device according to the present invention, each of the first FET and the second FET may be so configured that the electron channel layer is sandwiched by thin insulating layers, a first gate electrode is formed on an opposed surface of the insulating layer of the semiconductor, a second gate electrode is formed on the opposed surface of the other insulating layer, respective threshold voltages are controlled by a voltage applied to the first gate electrode, and a current in the electron channel layer is controlled by a voltage applied to the second gate electrode.

In the present invention, without using an n-type or a p-type semiconductor, thus, without using a p-type channel FET or an n-type channel FET, graphene is introduced into an electron channel layer of the FET (hereinafter referred to as a graphene channel FET), and by utilizing an ambipolar characteristic (single pole bilateral characteristic operating in an electron mode and a hole mode) of a graphene material so as to replace a p-type channel FET and an n-type channel FET in the prior-art CMOS logic gate by two graphene channel FETs with different threshold values, a complementary logic operation equivalent to the CMOS is realized.

DESCRIPTION OF EMBODIMENTS

A complementary logic gate device of embodiments of the present invention will be described below referring to the attached drawings.

Figure 1:
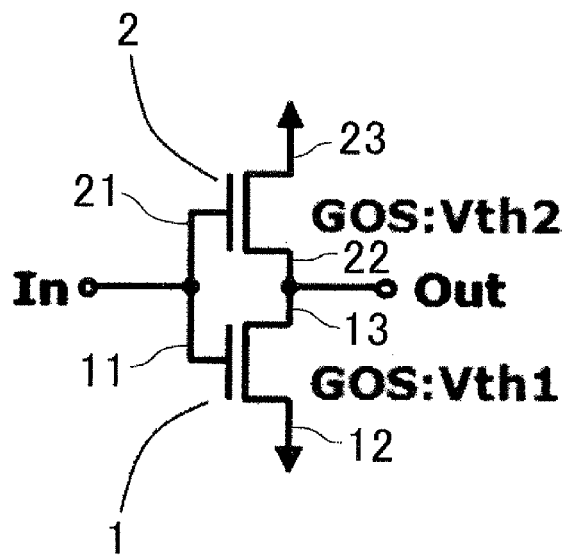
FIG. 1 is a circuit diagram illustrating a complementary logic gate device of a first embodiment of the present invention.
Figure 2:
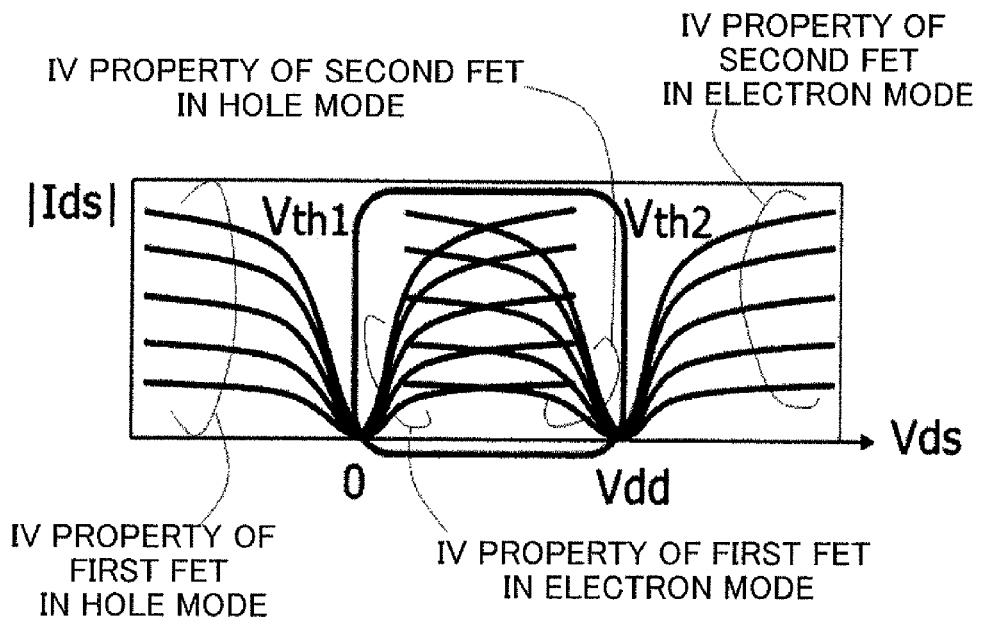
FIG. 2 is a graph illustrating current-voltage characteristics of first and second FETs of the complementary logic gate device shown in FIG. 1.

FIG. 1 shows a configuration example of the complementary logic gate device illustrating a first embodiment of the present invention. For example, two FETs, that is, a first FET 1 and a second FET 2 with an electron channel layer formed by graphene, an ambipolar characteristic (single pole bilateral characteristic), and different threshold values, are prepared. Supposing that threshold voltages of the first FET 1 and the second FET 2 are Vth1 and Vth2, respectively, drain current-drain voltage characteristics of the first FET 1 and the second FET 2 have, as the FET current-voltage characteristic of the complementary logic gate device illustrating the first embodiment of the present invention shown in FIG. 2, a so-called ambipolar (single pole bilateral) characteristic in which an FET characteristic by electron transport of a region: Vds>Vth1, 2 and an FET characteristic by hole transport of a region: Vds<Vth1, 2 are both provided with Vth1 and Vth2 as a border.

A complementary inverter logic gate is configured by connecting the first FET 1 and the second FET 2 as in FIG. 1. That is, a gate electrode 11 of the first FET 1 and a gate electrode 21 of the second FET 2 are short-circuited to have an input terminal, a source electrode 12 of the first FET 1 is set at a low potential, a drain electrode 13 of the first FET 1 and a source electrode 22 of the second FET 2 are connected to have an output terminal, and a drain electrode 23 of the second FET 2 is set at a high potential. Here, a power source condition similar to a usual CMOS logic gate, that is, a case in which the source electrode 12 of the first FET 1 is grounded, and a power voltage: Vdd is applied to the drain electrode 23 of the second FET 2 will be described. At this time, Vth1 is set at a source potential of the first FET 1: 0V and Vth2 at a drain voltage of the second FET 2: Vdd, respectively. Also, channel resistances of the first FET 1 and the second FET 2 are ideally zero in the ON state and ideally infinite in the OFF state.

Figure 3:
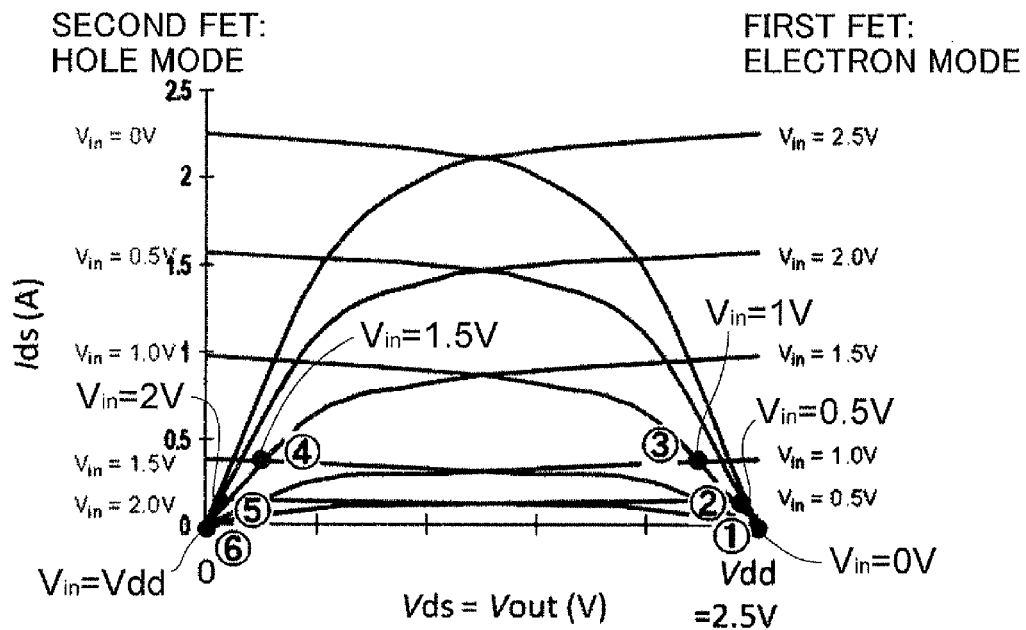
FIG. 3 is a graph illustrating an operating current output voltage characteristic by numerical analysis of the complementary logic gate device shown in FIG. 1.

FIG. 3 shows a current-voltage characteristic (characteristic in the form of a broom from the lateral axis 0V to the upper right) in an electron mode of the first FET 1 and a current-voltage characteristic (characteristic in the form of a broom from the lateral axis Vdd to the upper left) in a hole mode of the second FET 2 in a range of a drain bias from 0V (=Vth1) to Vdd (=Vth2) in a superimposed manner. The lateral axis can be read as a drain-source potential of the first FET 1, that is, as an output potential: Vout. Since the input potential and output potential of the logic gate satisfy the current-voltage characteristics of both the first FET 1 and the second FET 2 shown in FIG. 3 at the same time, it is necessary to pay attention to the fact that an intersection of the current-voltage characteristics of the first FET 1 and the second FET 2 gives an operation point.

When the applied potential into the input terminal is 0V, since the gate potential of the first FET 1 is equal to Vth1, the first FET 1 is in the OFF state, and the gate potential of the second FET 2 is far lower than Vth2 (by Vdd), the second FET 2 is in the ON state in the hole mode. Therefore, the operation point at this time is 1 (circled number) in FIG. 3, and the output potential is equal to the drain potential; Vdd of the second FET 2 in the ON state. Since the first FET 1 is in the OFF state, a drain current (that is, an operating current of the logic gate) does not flow.

If the input potential is gradually raised from 0V, since the gate potential of the first FET 1 is gradually raised from Vth1, the first FET 1 is brought into the ON state in the electron mode, and the drain current is to increase. Since the gate potential of the second FET 2 is gradually approaching Vth2, the second FET 2 gradually approaches the OFF state from the ON state in the hole mode, and the drain current is to decrease. Since the both conditions are satisfied, and the drain current of the first FET 1 becomes equal to the drain current of the second FET 2, the output potential is gradually lowered from Vdd via the operation points indicated by 2 (circled number) to 5 (circled number) as shown in FIG. 3.

When the input potential reaches Vdd, since the first FET 1 is in the ON state and the second FET 2 is in the OFF state, the operation point is 6 (circled number) in FIG. 3, and the output potential is conducted with the source potential of the first FET 1 and becomes 0V. At this time, the operating current of the logic gate does not flow.

Figure 4:
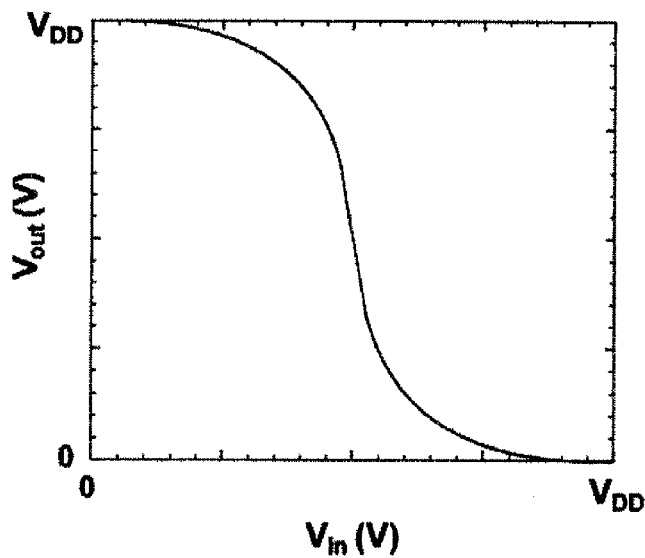
FIG. 4 is a graph illustrating an input/output voltage characteristic by numerical analysis of the complementary logic gate device shown in FIG. 1.

Assuming the current-voltage characteristic shown in FIG. 3, a result of numerical analysis of an input/output voltage characteristic of the logic gate device is shown in FIG. 4. By giving a logic low-level input at the threshold value of the first FET 1: Vth1 (=0V) and a logic high-level input at the threshold value of the second FET 2: Vth2 (=Vdd) to this device, a logic inverted output, that is, a logic high-level output: Vth2 (=Vdd) and a logic low-level output: Vth1 (=0v) are obtained, and moreover, a complementary logic operation in which an operating current does not flow when the logic level is a high/low level but a current flows only while the logic level is in transition can be realized, which is totally equivalent to the CMOS inverter logic gate.

Figure 5:
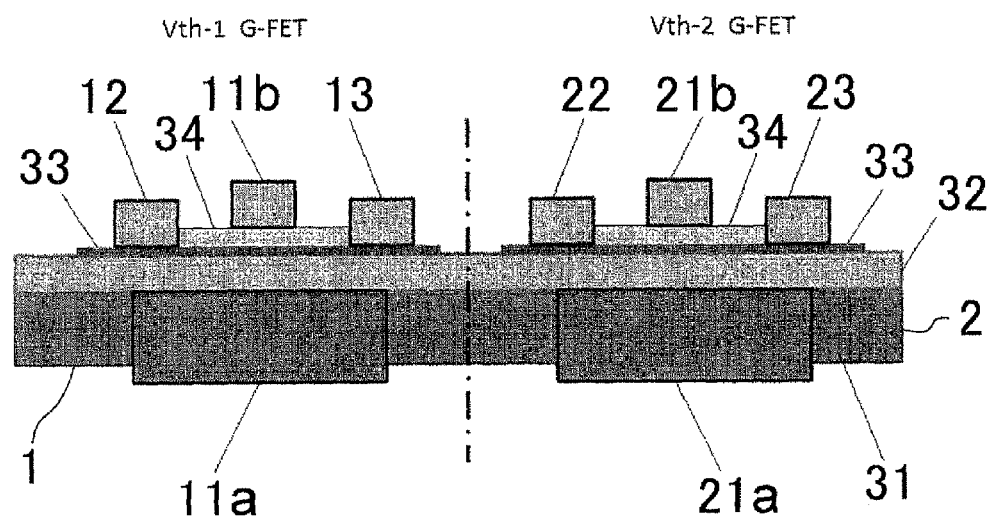
FIG. 5 is a sectional view illustrating first and second FETs of a complementary logic gate device of a second embodiment of the present invention.
Figure 6:
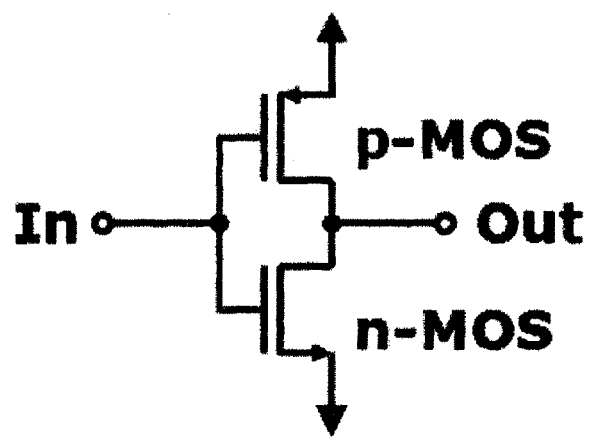
FIG. 6 is a circuit diagram illustrating a prior-art complementary logic gate device by a silicon. CMOS.
Figure 7:
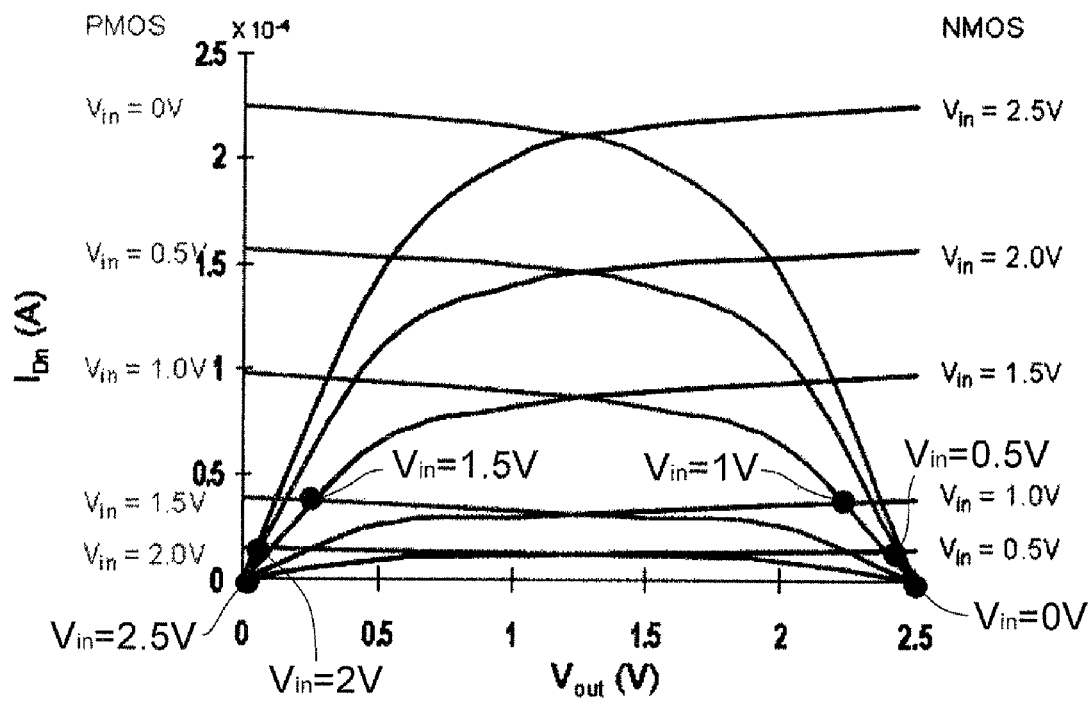
FIG. 7 is a graph illustrating an operating current output voltage characteristic of the prior-art complementary logic gate device by a silicon CMOS.

As means that realizes the above-described logic gate device, as in a configuration example of the first FET 1 and the second FET 2 in the second embodiment of the present invention shown in FIG. 5, an FET having an ambipolar (single pole bilateral) characteristic and capable of controlling a threshold value by a back-gate potential can be configured. As an insulating film 32, SiC is made to grow, for example, on a semi-insulating semiconductor substrate 31, and graphene 33 is formed as an electron channel layer in a transistor forming region on the upper face thereof. On both ends of the graphene 33, the source electrodes 12 and 22 and the drain electrodes 13 and 23 are formed. On the SiC lower face of a transistor forming portion, conductive first gate electrodes 11*a* and 21*a* are formed. These are gate electrodes generally called back gates. On the other hand, on the upper face of the graphene 33, second gate electrodes 11*b* and 21*b* are formed through an insulating layer 34. These are gate electrodes generally called top gates. The first gate (back-gate) electrodes 11*a* and 21*a* act in order to control the threshold value, while the second gate (top-gate) electrodes 11*b* and 21*b* act in order to control a drain current as usual gate electrodes. This will be described below.

First, by forming the electron channel layers of the first FET 1 and the second FET 2 by the graphene 33, the single pole bilateral characteristic can be realized from the features specific to graphene. Subsequently, by a potential to be applied to the first gate (back-gate) electrodes 11*a* and 21*a*, electron/hole concentration in the electron channel layer can be modulated, and unless a potential of the second gate (top-gate) electrodes 11*b* and 21*b* is applied by a portion to offset an electron or hole charge induced in the electron channel layer by the potential applied to the first gate (back-gate) electrodes 11*a* and 21*a*, a carrier neutral condition in the electron channel layer is not realized. That is, this means that the threshold value is shifted by the potentials of the applied first gate (back-gate) electrodes 11*a* and 21*a*. Therefore, by means of the bias potential to be applied to the first gate (back-gate) electrodes 11*a* and 21*a*, the threshold values of the first FET 1 and the second FET 2 can be controlled. In addition, since it was verified both from theory and experiments that with the graphene material, the electron/hole shows a totally symmetric transport property, an effective mass is ideally lost, and therefore, the electron/hole both realize mobility higher than a usual silicon semiconductor by more than two order of magnitude and even than a compound semiconductor by more than one order of magnitude, not only that ultra large-scale integration and ultra low power consumption can be realized as in the prior-art silicon CMOS logic integration circuit but also an extremely excellent super high speed performance drastically exceeding an operating speed of the prior-art silicon CMOS logic integration circuit, can be realized at the same time.

It is needless to say that means that controls a threshold value of an FET can be realized by applying a generally known technology of control of an insulating film thickness or selection of a gate metal material with a different work function, in addition to those described above.

Industrial Applicability

The present invention can realize ultra low power consumption and super large scale integration of the prior-art CMOS integration circuit at the same time while a super high speed characteristic of the graphene material is obtained. The present invention is an extremely advantageous invention to become a breakthrough that solves technical saturation faced by the current semiconductor technology roadmap.

REFERENCE SIGNS LIST

1 first FET
11 gate electrode
12 source electrode
13 drain electrode
2 second FET
21 gate electrode
22 source electrode
23 drain electrode
31 semiconductor substrate
32 insulating film
33 graphene
34 insulating layer

The invention claimed is:

1. A complementary logic gate device, comprising:
a first FET and a second FET with an electron channel layer formed by a graphene material, the first FET and the second FET having an ambipolar characteristic, and different threshold values, wherein
a gate electrode of said first FET and a gate electrode of said second FET are short-circuited to have an input terminal,
a source electrode of said first FET is set at a low potential,
a drain electrode of said first FET and a source electrode of said second FET are connected to have an output terminal,
a drain electrode of said second FET is set at a high potential,
a threshold value of said first FET is set at a first level,
a threshold value of said second FET is set at a second level higher than said first level, and
a logic low level and a logic high level of the input signal are matched with said first level and said second level, respectively.

2. The complementary logic gate device according to claim 1, wherein
in said first FET and said second FET, said electron channel layer is sandwiched by a pair of insulating layers,
a first gate electrode is formed on the surface of one of the insulating layers,
a second gate electrode is formed on the surface of the other insulating layer,
a voltage of said threshold value can be controlled by a voltage to be applied to said first gate electrode, and
a current in said electron channel layer can be controlled by a voltage to be applied to said second gate electrode.

* * * * *